United States Patent
Kimoto (10) Patent No.: US 11,634,842 B2
(45) Date of Patent: Apr. 25, 2023

(54) STRETCHABLE WIRE MEMBER

(71) Applicant: SEKISUI POLYMATECH CO., LTD., Saitama (JP)

(72) Inventor: Takaya Kimoto, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 134 days.

(21) Appl. No.: 17/285,772

(22) PCT Filed: Nov. 1, 2019

(86) PCT No.: PCT/JP2019/043004
§ 371 (c)(1),
(2) Date: Apr. 15, 2021

(87) PCT Pub. No.: WO2020/095833
PCT Pub. Date: May 14, 2020

(65) Prior Publication Data
US 2021/0381140 A1    Dec. 9, 2021

(30) Foreign Application Priority Data
Nov. 6, 2018   (JP) .............................. JP2018-209283

(51) Int. Cl.
H05K 1/02      (2006.01)
D04B 1/10      (2006.01)

(52) U.S. Cl.
CPC ........... *D04B 1/102* (2013.01); *H05K 1/0283* (2013.01)

(58) Field of Classification Search
CPC ............................. D04B 1/102; H05K 1/0283
See application file for complete search history.

(56) References Cited

U.S. PATENT DOCUMENTS

| | | |
|---|---|---|
| 6,069,097 A | 5/2000 | Suzuki et al. |
| 2007/0299471 A1 | 12/2007 | Takahashi et al. |
| 2011/0230747 A1 | 9/2011 | Rogers et al. |
| 2014/0163390 A1 | 6/2014 | Rogerts et al. |

(Continued)

FOREIGN PATENT DOCUMENTS

| | | |
|---|---|---|
| CN | 103959396 A | 7/2014 |
| CN | 107851490 A | 3/2018 |

(Continued)

OTHER PUBLICATIONS

International Search Report for PCT Patent App. No. PCT/JP2019/043004 (dated Jan. 21, 2020).

*Primary Examiner* — Hoa C Nguyen
(74) *Attorney, Agent, or Firm* — Cermak Nakajima & McGowan LLP; Tomoko Nakajima (57) ABSTRACT

An object is to solve problems associated with a stretchable wire member that includes, for example, a garment with stretchable wires formed thereon, that is, to solve the problems of wrinkles and undulations that often occur after the garment is stretched. A stretchable wire member includes a fabric; a base layer disposed on a surface of the fabric; a conductive layer disposed in part of the fabric, the conductive layer being on a surface of the base layer; and a protective layer covering the conductive layer. In the stretchable wire member, an elastic modulus $E'3$ of a multilayer body portion including the fabric, the base layer, and the protective layer ranges from 1 MPa to 6 MPa.

15 Claims, 4 Drawing Sheets

(56) References Cited

U.S. PATENT DOCUMENTS

| | | |
|---|---|---|
| 2016/0157343 A1 | 6/2016 | Abe et al. |
| 2017/0164461 A1 | 6/2017 | Lathrop et al. |
| 2017/0181276 A1* | 6/2017 | Sawada .................. B32B 27/38 |
| 2017/0188455 A1* | 6/2017 | Tomita ................. H05K 3/0011 |
| 2018/0028115 A1 | 2/2018 | Kwon et al. |
| 2018/0168028 A1 | 6/2018 | Sekimoto |
| 2018/0347081 A1* | 12/2018 | Kurahashi ................ D04B 1/18 |
| 2019/0013275 A1* | 1/2019 | Sunshine ............ H01L 23/5386 |
| 2019/0053372 A1 | 2/2019 | Kwon et al. |

FOREIGN PATENT DOCUMENTS

| | | |
|---|---|---|
| CN | 108601409 A | 9/2018 |
| EP | 2924695 A1 | 9/2015 |
| JP | 2000-148290 A | 5/2000 |
| JP | 2005-137456 A | 6/2005 |
| JP | 2007-173226 A | 7/2007 |
| JP | 2013-524866 A | 6/2013 |
| JP | 2016-076531 A | 5/2016 |
| JP | 2017-537467 A | 12/2017 |
| JP | 2018-148150 A | 9/2018 |
| TW | 201825013 A | 7/2018 |
| WO | WO2011/115643 A1 | 9/2011 |
| WO | WO2016/114339 A1 | 7/2016 |

\* cited by examiner

STRETCHABLE WIRE MEMBER

This application is a national phase entry under 35 U.S.C. § 371 of PCT Patent Application No. PCT/JP2019/043004, filed on Nov. 1, 2019, which claims priority under 35 U.S.C. § 119 to Japanese Patent Application No. 2018-209283, filed Nov. 6, 2018, both of which are incorporated by reference.

TECHNICAL FIELD

The present application relates to a stretchable wire member that includes a flexible base material with stretchable wires.

BACKGROUND ART

In recent years, there have been developed an increasing number of wearable devices (e.g., smartwatches, spirometers, and pulsimeters) that are equipped with sensors for measuring physical conditions, such as pulse rate, or physical movements, such as the number of footsteps. Conventional wearable devices have used an electronic module in which semiconductor elements are disposed on a flexible substrate or a hard substrate. The electronic module for wearable devices has not been comfortable to wear, because it does not follow the body movement. Accordingly, techniques have been developed which use a stretchable wire member, including a stretchable elastic body or garment with stretchable conductive wires formed thereon, to provide a flexible wearable device. Such techniques are described, for example, in Japanese Unexamined Patent Application Publication No. 2016-076531 (PTL 1), Japanese Unexamined Patent Application Publication No. 2005-137456 (PTL 2), Japanese Unexamined Patent Application Publication No. 2000-148290 (PTL 3), and International Publication No. 2016/114339 (PTL 4).

CITATION LIST

Patent Literature

PTL 1: Japanese Unexamined Patent Application Publication No. 2016-076531
PTL 2: Japanese Unexamined Patent Application Publication No. 2005-137456
PTL 3: Japanese Unexamined Patent Application Publication No. 2000-148290
PTL 4: International Publication No. 2016/114339

SUMMARY OF INVENTION

Technical Problem

The conventional stretchable wire member that includes, for example, a garment with stretchable wires formed thereon has a problem in that when the garment is stretched to a large degree, wrinkles or undulations occur around the boundary between the garment and the stretchable wires when the garment is returned to its original state.

Accordingly, an object of the present application is to reduce, in a stretchable wire member including for example a garment with stretchable wires formed thereon, the occurrence of wrinkles and undulations in the stretchable wire member after the garment is stretched.

Solution to Problem

One aspect of the present invention is a stretchable wire member that includes a fabric; a base layer disposed on a surface of the fabric; a conductive layer disposed in part of the fabric, the conductive layer being on a surface of the base layer; and a protective layer covering the conductive layer. In the stretchable wire member, an elastic modulus $E'3$ of a multilayer body portion including the fabric, the base layer, and the protective layer ranges from 1 MPa to 6 MPa.

The one aspect is a stretchable wire member that includes a fabric; a base layer disposed on a surface of the fabric; a conductive layer disposed in part of the fabric, the conductive layer being on a surface of the base layer; and a protective layer covering the conductive layer. This enables the conductive layer to stretch to some degree while maintaining stretchability of the fabric. Also, since the elastic modulus $E'3$ of the multilayer body portion including the fabric, the base layer, and the protective layer ranges from 1 MPa to 6 MPa, it is possible to reduce, after the stretchable wire member is stretched, the occurrence of wrinkles in the stretchable wire member and the occurrence of wave-like undulations in the fabric.

In the one aspect, there is no strict definition that separates "wrinkles" and "undulations". "Wrinkles" and "undulations" both refer to a deformation where at least one raised portion or at least one lowered portion is formed in the direction in which the fabric and the base layer are stacked, and specifically refer to a deformation where at least the amplitude of loops of fibers constituting the fabric is greater than the width thereof.

The one aspect may be configured as a stretchable wire member in which an elastic modulus $E'4$ of a multilayer body portion including the fabric, the base layer, the conductive layer, and the protective layer ranges from 3 MPa to 8 MPa, and a relation $E'4>E'3$ is satisfied. In the one aspect, even when the stretchable wire member is stretched and then returned to normal by being released from the stretching force, wrinkles in the stretchable wire member and undulations in the fabric are less likely to occur, and the original pre-stretch state can be restored.

The one aspect may be configured as a stretchable wire member in which the multilayer body portion including the fabric, the base layer, and the protective layer is a portion not having the conductive layer, the portion being outside a region having the conductive layer. In the one aspect, when the portions with and without the conductive layer of one stretchable wire member are configured to have a predetermined relation, wrinkles or undulations are less likely to occur, and the original pre-stretch state can be restored.

The one aspect may be configured as a stretchable wire member in which an undulation length measured after the stretchable wire member is stretched 100% is less than or equal to 7%. That is, in a stretchable wire member that includes a fabric; a base layer disposed on a surface of the fabric; a conductive layer disposed in part of the fabric, the conductive layer being on a surface of the base layer; and a protective layer covering the conductive layer, an undulation length measured after the stretchable wire member is stretched 100% is less than or equal to 7%, and an elastic modulus $E'3$ of a multilayer body portion including the fabric, the base layer, and the protective layer ranges from 1 MPa to 6 MPa. Thus, even when the stretchable wire member is stretched and then returned to normal by being released from the stretching force, wrinkles in the stretchable wire member or wave-like undulations in the fabric are less likely to occur, and the original pre-stretch state can be restored.

The one aspect may be configured as a stretchable wire member in which an undulation height measured after the stretchable wire member is stretched 100% is less than or equal to 7 mm. That is, in a stretchable wire member that includes a fabric; a base layer disposed on a surface of the fabric; a conductive layer disposed in part of the fabric, the conductive layer being on a surface of the base layer; and a protective layer covering the conductive layer, an undulation height measured after the stretchable wire member is stretched 100% is less than or equal to 7 mm, and an elastic modulus E'3 of a multilayer body portion including the fabric, the base layer, and the protective layer ranges from 1 MPa to 6 MPa. Thus, even when the stretchable wire member is stretched and then returned to normal by being released from the stretching force, wrinkles in the stretchable wire member or wave-like undulations in the fabric are less likely to occur, and the original pre-stretch state can be restored.

The one aspect may be configured as a stretchable wire member in which the number of undulations counted, in a 50 mm pre-stretch length range, after 100% stretch is one or zero. That is, in a stretchable wire member that includes a fabric; a base layer disposed on a surface of the fabric; a conductive layer disposed in part of the fabric, the conductive layer being on a surface of the base layer; and a protective layer covering the conductive layer, the number of undulations per unit length counted, in a 50 mm pre-stretch length range, after 100% stretch is one or zero, and an elastic modulus E'3 of a multilayer body portion including the fabric, the base layer, and the protective layer ranges from 1 MPa to 6 MPa. Thus, even when the stretchable wire member is stretched and then returned to normal by being released from the stretching force, wrinkles in the stretchable wire member or wave-like undulations in the fabric are less likely to occur, and the original pre-stretch state can be restored.

The one aspect may be configured as a stretchable wire member in which an elastic modulus E'3 of a multilayer body portion including the fabric, the base layer, and the protective layer ranges from 1 MPa to 6 MPa, a frequency dependence represented by a difference between a storage elastic modulus E'3 measured at a frequency of 0.1 Hz and a storage elastic modulus E'4 measured at a frequency of 28 Hz is less than or equal to 0.6 MPa. That is, in a stretchable wire member that includes a fabric; a base layer disposed on a surface of the fabric; a conductive layer disposed in part of the fabric, the conductive layer being on a surface of the base layer; and a protective layer covering the conductive layer, an elastic modulus E'3 of a multilayer body portion including the fabric, the base layer, and the protective layer ranges from 1 MPa to 6 MPa, and a frequency dependence represented by a difference between a storage elastic modulus E'3 measured at a frequency of 0.1 Hz and a storage elastic modulus E'4 measured at a frequency of 28 Hz is less than or equal to 0.6 MPa. Thus, even when the stretchable wire member is stretched and then returned to normal by being released from the stretching force, wrinkles in the stretchable wire member or wave-like undulations in the fabric are less likely to occur, and the original pre-stretch state can be restored.

The one aspect may be configured as a stretchable wire member in which an elastic modulus E'1 of the base layer ranges from 1 MPa to 10 MPa, an elastic modulus E'2 of the conductive layer ranges from 2 MPa to 60 MPa, and a 100% stretch distortion is less than or equal to 10%. That is, in a stretchable wire member that includes a fabric; a base layer disposed on a surface of the fabric; and a conductive layer disposed in part of the fabric, the conductive layer being on a surface of the base layer, an elastic modulus E'1 of the base layer ranges from 1 MPa to 10 MPa, an elastic modulus E'2 of the conductive layer ranges from 2 MPa to 60 MPa, and a 100% stretch distortion is less than or equal to 10%. Thus, even without a protective layer and even when the stretchable wire member is stretched and then returned to normal by being released from the stretching force, wrinkles in the stretchable wire member or wave-like undulations in the fabric are less likely to occur, and the original pre-stretch state can be restored.

The one aspect may be configured as a stretchable wire member in which the fabric is at least one knit that is made in plain stitch, rib stitch, smooth stitch, or any one or combination of textural variations of the stitches, and a longitudinal direction of the conductive layer is a course direction of the knit. When the stretchable wire member is one in which the fabric is at least one knit that is made in plain stitch, rib stitch, smooth stitch, or any one or combination of textural variations of the stitches, and a longitudinal direction of the conductive layer is a course direction of the knit, then the presence of the knit can improve stretchability, and at the same time, the occurrence of undulations caused by the presence of the knit can be reduced. Thus, even when the stretchable wire member is one that includes the conductive layer formed in the knit, and even when the stretchable wire member is stretched and then returned to normal by being released from the stretching force, wrinkles or undulations in the stretchable wire member are less likely to occur, and the original pre-stretch state can be restored.

The one aspect may be configured as a stretchable wire member in which the fabric is a knit that is made in purl stitch or a textural variation thereof, and a longitudinal direction of the conductive layer is a wale direction of the knit. Since the fabric is a knit that is made in purl stitch or a textural variation thereof, and a longitudinal direction of the conductive layer is a wale direction of the knit, the knit structure can improve stretchability of the fabric, and can, at the same time, reduce the occurrence of undulations caused by the presence of the knit. Thus, even when the stretchable wire member is one that includes the conductive layer formed in the knit, and even when the stretchable wire member is stretched and then returned to normal by being released from the stretching force, wrinkles or undulations in the stretchable wire member are less likely to occur, and the original pre-stretch state can be restored.

The one aspect may be configured as a stretchable wire member in which the fabric is at least one knit that is made in tricot, denbigh stitch, vandyke stitch, cord stitch, or any one or combination of textural variations of the stitches, and a longitudinal direction of the conductive layer is a course direction of the knit. Since the fabric is a knit that is made in tricot, denbigh stitch, vandyke stitch, cord stitch, or any one or combination of textural variations of the stitches, and a longitudinal direction of the conductive layer is a course direction of the knit, the knit structure can improve stretchability of the fabric, and can, at the same time, reduce the occurrence of undulations caused by the presence of the knit. Thus, even when the stretchable wire member is one that includes the conductive layer formed in the knit, and even when the stretchable wire member is stretched and then returned to normal by being released from the stretching force, wrinkles or undulations in the stretchable wire member are less likely to occur, and the original pre-stretch state can be restored.

The one aspect may be configured as a stretchable wire member in which the base extends outward more than 2 mm from an outer edge of the conductive layer. In the stretchable wire member including the base that extends outward more than 2 mm from the outer edge of the conductive layer, even when the base layer has a larger area than the conductive layer, wrinkles or undulations are less likely to occur, and the original pre-stretch state can be restored.

Advantageous Effects of Invention

In the stretchable wire member according to the present invention, even when the stretchable wire member is stretched and then returned to normal by being released from the stretching force, wrinkles or undulations are less likely to occur in the stretchable wire member.

BRIEF DESCRIPTION OF DRAWINGS

FIG. 1 schematically illustrates a plain stitch, with FIG. 1A being a plan view of the plain stitch and FIG. 1B being a cross-sectional view taken along line IB-IB in FIG. 1A.

FIG. 4 schematically illustrates a rib stitch, with FIG. 4A being a plan view of the rib stitch and FIG. 4B being a cross-sectional view taken along line IVB-IVB in FIG. 4A.

DESCRIPTION OF EMBODIMENTS

A stretchable wire member according to one aspect of the present invention is one that includes a fabric, such as a woven or knitted fabric, having a conductive layer formed thereon, which is to be formed into conductive stretchable wires. A base layer is formed between the fabric and the stretchable wires, and the surface of the stretchable wires is covered with a protective layer as necessary. Each part of the stretchable wire member will now be described.

<Fabric>: Fabric is a fiber sheet. Examples of the fabric include a woven fabric, a knit (or knitted fabric), and a non-woven fabric. A fabric is made into a garment, for example, by sewing in such a way that it can be worn by an individual (or person). Fibers constituting the fabric are not limited to specific types, and natural fibers or synthetic fibers commonly used may be used. Inorganic fibers, such as glass fibers, may also be used. For wearing purposes, it is preferable to use insulating flexible fibers, such as cotton, wool, rayon, nylon, polyester, polyurethane, or acrylic fibers.

Of various types of fabrics, a woven fabric made by crossing warps and wefts is less stretchable in the weaving direction, except when stretchable yarns are used. However, woven fabrics are firmer and more resistant to deformation and tension than knits, and thus are used in many textile products, such as clothes (e.g., jackets and pants) and household goods (e.g., carpets).

On the other hand, a knit is a continuous cloth (knitted fabric) formed by intertwined loops (or stitches) of fibers. The intertwining of the loops allows the fibers to move relatively freely. Moreover, a three-dimensional structure of stitches allows the cloth to stretch significantly. As compared to woven fabrics, therefore, knits are more extensible, more flexible and softer in texture, and offer more warmth and breathability because of their three-dimensional stitches.

The knits are thus suitably used to make, for example, protective clothing against cold weather, underwear, socks that require a good fit, and sportswear that makes use of the flexibility.

Knitting can be divided into weft knitting and warp knitting. Weft knitting involves connecting loops in the horizontal direction to form a knitted fabric, whereas warp knitting involves connecting loops in the vertical direction. In knitting, a vertical row of loops of the cloth is referred to as "wale", whereas a horizontal row of loops of the cloth is referred to as "course". The number of loops per inch is indicated by "gauge". In other words, a gauge count in the wale direction indicates the number of yarns per inch in the course direction, whereas a gauge count in the course direction indicates the number of loops per inch. For example, if the pattern illustrated in FIG. 1A (described below) is in a one-inch square region, the gauge count in the wale direction is four and the gauge count in the course direction is three. The gauge count can be measured by visual observation or by observation using an optical microscope.

Depending on the type of knitting, stitches are three-dimensionally crossed in various ways. Typical examples of the types of weft knitting include plain stitch, rib stitch, smooth stitch, purl stitch, and their textural variations. Typical examples of the types of warp knitting include two-way tricot, denbigh stitch, vandyke stitch, and cord stitch.

In one aspect and embodiment of the present invention, for plain stitch, rib stitch, smooth stitch, or any one or combination of their textural variations of the types of knitting described above, it is preferable that a conductive layer be provided in such a way that the longitudinal direction thereof is along the course direction of the knit and be used in such a way as to stretch in the course direction of the knit. For purl stitch or its textural variation, the conductive layer is preferably used in such a way as to stretch in the wale direction of the knit. For tricot, denbigh stitch, vandyke stitch, cord stitch, or any one or combination of their textural variations, the conductive layer is preferably used in such a way as to stretch along the course of the knit.

Also in the one aspect and embodiment of the present invention, for plain stitch, rib stitch, smooth stitch, purl stitch, tricot, denbigh stitch, vandyke stitch, cord stitch, or any one or combination of their textural variations, when fibers forming the knit include stretchable fibers, such as urethane fibers or rubber fibers, the conductive layer may be provided and used in a direction not limited to the direction of stitches described above. Note, however, that urethane fibers and rubber fibers may not be durable enough to withstand repetitive use. Therefore, when less stretchable fibers are used to form the knit, it is preferable, for plain stitch, rib stitch, smooth stitch, or any one or combination of their textural variations, that the conductive layer be used in such a way as to stretch in the course direction, also preferable, for purl stitch or its textural variation, that the conductive layer be used in such a way as to stretch in the wale direction, and also preferable, for tricot, denbigh stitch, vandyke stitch, cord stitch, or any one or combination of their textural variations, that the conductive layer be used in such a way as to stretch along the course.

Of various types of knitting, typical ones will be described, which include plain stitch, rib stitch, and smooth stitch.

Figure 1A:
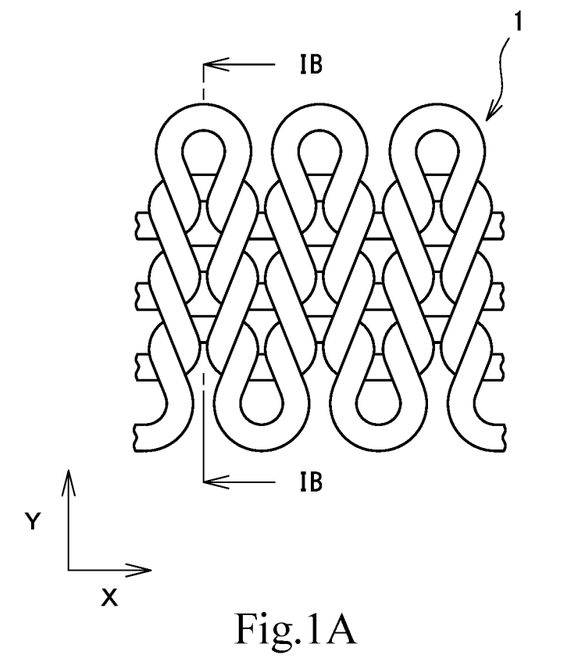
Figure 1B:
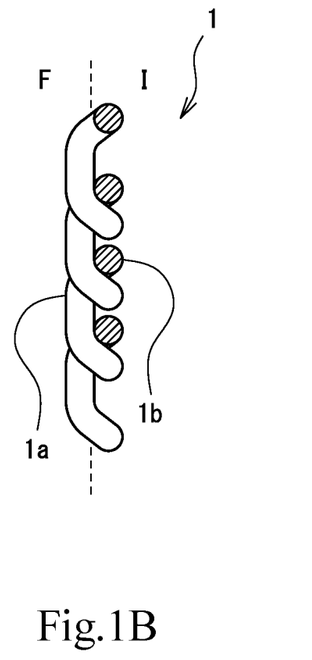

Plain stitch: FIG. 1 schematically illustrates a plain stitch 1 which is a typical knitting stitch. FIG. 1A is a plan view of the plain stitch 1, and FIG. 1B is a cross-sectional view of the plain stitch 1. For convenience, FIG. 1 illustrates three loops of each of four fibers that extend in the horizontal direction to form a pattern. In practice, such a pattern is repeated in the up, down, right, and left directions to form a knitted fabric. In FIG. 1A, the direction of the fibers extending in the horizontal direction (or X-direction in FIG. 1A) is a course direction in which the loops are intertwined, whereas the direction (or Y-direction in FIG. 1A) perpendicular to the course direction is a wale direction.

Figure 2:
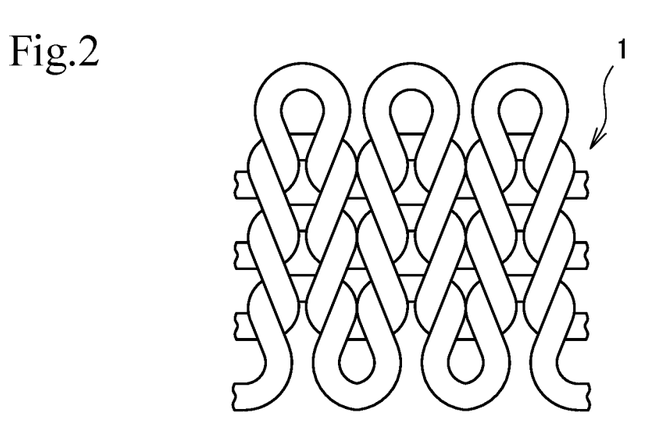
FIG. 2 is a plan view of the knitted fabric illustrated in FIG. 1A, stretched in an up-and-down direction.
Figure 3:
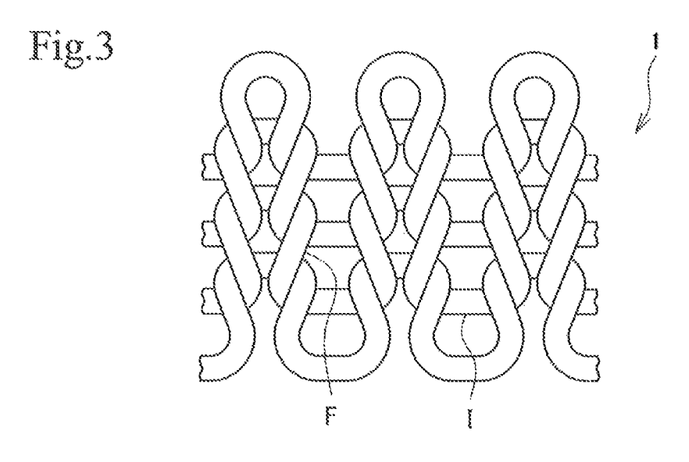
FIG. 3 is a plan view of the knitted fabric illustrated in FIG. 1A, stretched in a right-and-left direction.

FIG. 2 and FIG. 3 are schematic diagrams each illustrating the plain stitch 1, with the fibers therein being stretched. From the initial state illustrated in FIG. 1A, the fibers are stretched in the wale direction in FIG. 2 and stretched in the course direction in FIG. 3. As illustrated in FIG. 2 and FIG. 3, the stretch in the plain stitch 1 is greater in the course direction than in the wale direction. Note that the back side of the plain stitch 1 is shaped differently from the front side.

Figures 4A, 4B:
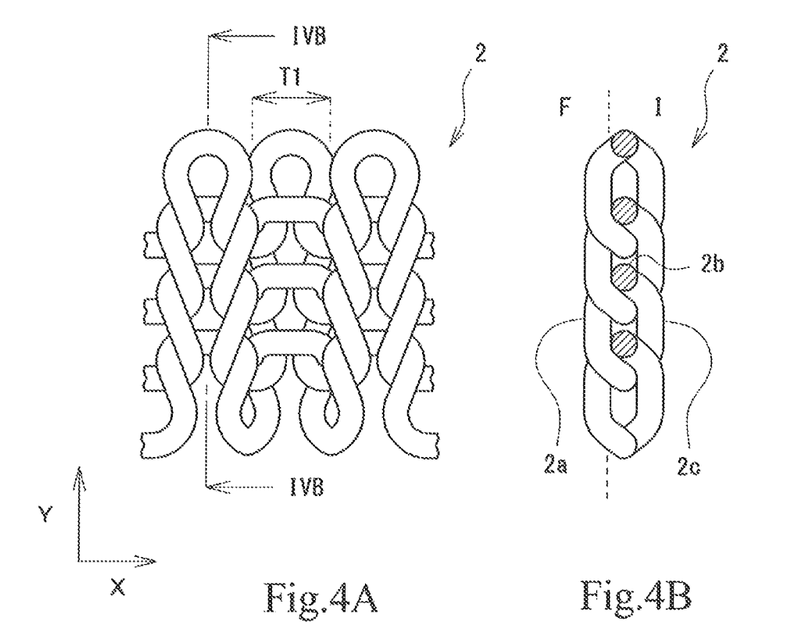
Figure 5:
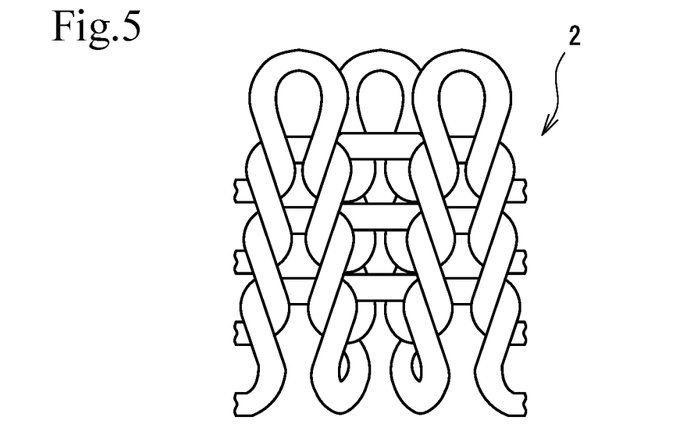
FIG. 5 is a plan view of the knitted fabric illustrated in FIG. 4A, stretched in an up-and-down direction.
Figure 6:
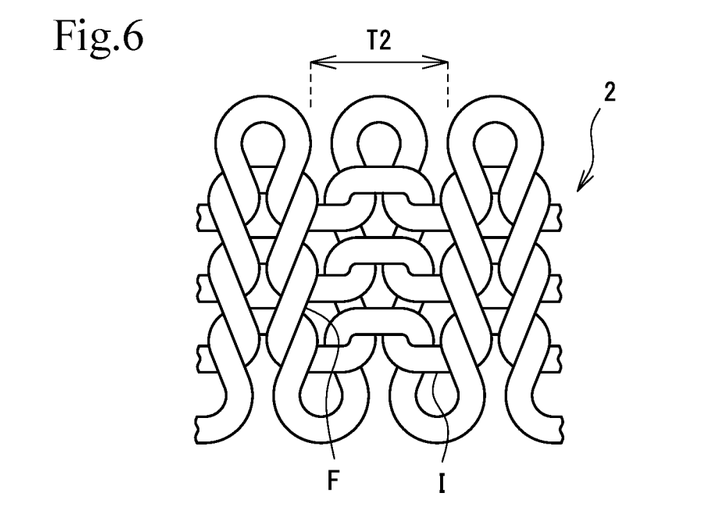
FIG. 6 is a plan view of the knitted fabric illustrated in FIG. 4A, stretched in a right-and-left direction.
Figure 7:
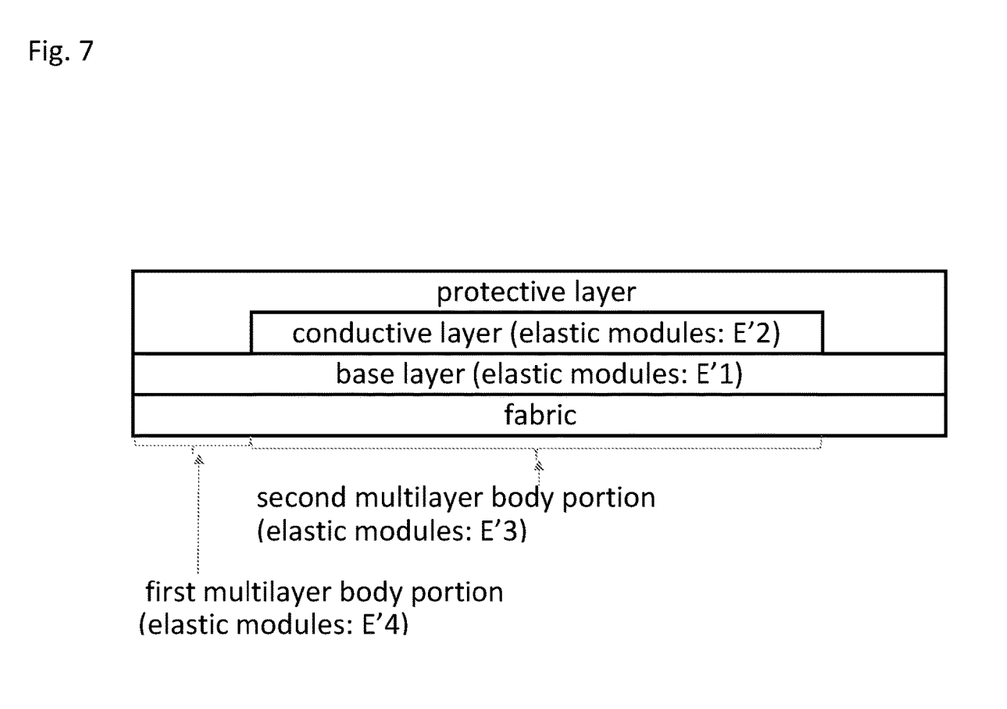
FIG. 7 is a cross sectional view schematically illustrating the stretchable wire member.

Rib stitch: FIG. 4 schematically illustrates a rib stitch 2. FIG. 4A is a plan view of the rib stitch 2, and FIG. 4B is a cross-sectional view of the rib stitch 2. The rib stitch 2 is characterized by its high stretchability in the course direction. FIG. 5 and FIG. 6 are schematic diagrams each illustrating the rib stitch 2, with the fibers therein being stretched. From the initial state illustrated in FIG. 4A, the fibers are stretched in the wale direction in FIG. 5 and stretched in the course direction in FIG. 6. FIG. 5 and FIG. 6 show that the stretch in the rib stitch 2 is greater in the course direction than in the wale direction, as in the plain stitch. In comparison, however, the stretch in the course direction in the rib stitch 2 is greater than that in the plain stitch 1. In the transition from FIG. 4 to FIG. 6 in the course direction, the entire cloth is stretched 130% (i.e., 1.3 times the initial length in the horizontal direction). Taking a distance T1 shown in FIG. 4A as 100%, a distance T2 shown in FIG. 6 is as much as 250%. As for the stretch in the wale direction, as illustrated in FIG. 5, the entire cloth is stretched substantially uniformly. In this case, the size in the course direction tends to be reduced. The rib stitch 2 forms the same pattern on both the front and back sides.

Smooth stitch: Smooth stitch is a variation of the rib stitch. While not shown, the smooth stitch provides a cloth such as that formed by combining two back sides of the rib stitch, and both sides of the cloth have substantially the same stitch as that of the front side of the rib stitch. Therefore, the front and back sides of the cloth appear the same. For example, if this cloth has a predetermined thickness and conductive layers are formed on both sides of the cloth in the same direction, the difference in the degree of curvature between the front and back sides of the cloth can be detected by measuring the difference in stretch between the conductive layers on both sides of the cloth.

Twisted yarns forming the fiber sheet are preferably about 0.01 mm to 1.0 mm in diameter. If twisted yarns of a knit have a diameter greater than 1.0 mm, the resulting large spaces between stitches make it difficult to form a conductive layer. The diameter described above may be smaller than 0.01 mm, but this may reduce strength against rubbing and degrade durability of the garment.

<Conductive Layer>: Conductive layer is a conductive region formed on a surface of the fabric. The conductive layer primarily includes a conductive filler that provides conductivity, and a polymeric matrix that holds the conductive filler. The conductive layer is formed by applying, onto a knit, a liquid conductive composition containing a stretchable binder resin and a conductive material dispersed therein.

Materials forming the conductive layer will now be described. Examples of the matrix with extensibility commonly used include crosslinked rubber and thermoplastic elastomer. Examples of the crosslinked rubber include silicone rubber, natural rubber, isoprene rubber, butadiene rubber, acrylonitrile-butadiene rubber, 1,2-polybutadiene, styrene-butadiene rubber, chloroprene rubber, nitrile rubber, butyl rubber, ethylene-propylene rubber, chlorosulfonated polyethylene rubber, acrylic rubber, epichlorohydrin rubber, fluorocarbon rubber, and urethane rubber. Examples of the thermoplastic elastomer include styrene thermoplastic elastomer, olefinic thermoplastic elastomer, ester thermoplastic elastomer, urethane thermoplastic elastomer, amide thermoplastic elastomer, vinyl chloride thermoplastic elastomer, and fluorinated thermoplastic elastomer. Of these materials, silicone rubber is preferable not only in that it can form a very flexible conductive layer and has relatively high resistance to weather, but also in that it meets various parameters specified in the present invention.

The hardness of the matrix is preferably in the 5 to 80 range in type-A hardness specified in JIS K6253. If the hardness is below A5, the matrix is too soft to ensure durability. If the hardness exceeds A80, on the other hand, the matrix is too hard and stretches very little; that is, it is not suitable for the purpose of offering stretchability. In recent years, there have been demands for materials that are comfortable for humans to touch. Therefore, it is preferable to use softer materials even within the preferable range.

Examples of the conductive filler include conductive powder, such as carbon or metal powder. For wires that transmit power and signals, it is preferable to use low-resistance metal powder. Among metal powders, a particularly preferable one is silver powder that has some degree of weather resistance and a very low resistance value. The conductive filler is not limited to a particular shape, but a conductive filler in a fibrous form is relatively small in amount and low in resistance. A conductive filler in a flaky powder form is not only relatively small in amount and low in resistance, but also does not significantly change its resistivity when stretched.

It is preferable that the conductive filler described above be added to occupy 15% to 50% by volume of the conductive layer. If the conductive filler is less than 15% by volume, the resistance value may be too high. If the conductive filler exceeds 50% by volume, the proportion of the matrix that holds the conductive filler may be too small to prevent the conductive layer from cracking and breaking when stretched.

On the other hand, when it is desirable to form a conductive layer having a resistance value that varies significantly when the conductive layer is stretched, it is preferable to use carbon powder. Preferred examples of the conductive layer having a resistance value that varies significantly when the conductive layer is stretched include a conductive layer that is made of a conductive resin in which 100 parts by mass of silicone include 3.8 to 15 parts by mass of Ketjenblack (or 3.6% to 23% by volume of the conductive layer) and 0 to 45 parts by mass of graphite (or 0% to 48% by volume of the conductive layer). If the amount of Ketjenblack added is less than 3.8 parts by mass, it is difficult to achieve desired conductivity and durability, whereas if the amount of Ketjenblack added exceeds 15 parts by mass, the viscosity of the composition mixed with silicone increases and the conductive layer is more likely to crack when stretched. If the amount of graphite added is less than 30 parts by mass, the resistance is less likely to change at an appropriate rate as the conductive layer stretches, whereas if the amount of graphite added exceeds 45 parts by mass, the viscosity of the composition mixed with silicone increases and durability to withstand stretching of the conductive layer is degraded.

The conductive layer is preferably formed by printing with a liquid conductive paste. As a conductive paste, a liquid composition that contains a binder to be formed into the matrix and a conductive filler may be used. Examples of the liquid composition include a material formed by dispersing the conductive powder into a curable liquid resin, such as a combination of polyorganosiloxane and hydrogen organo polysiloxane, containing an alkenyl group or a combination of polyurethane polyol and isocyanate, or into a solvent containing various rubbers or elastomers dissolved therein. The conductive paste may include a solvent. Using a solvent enables adjustment of graphite and Ketjenblack in terms of their dispersibility, capability of being applied to the surface of base material, and viscosity.

To form the conductive layer by printing with a conductive paste, the conductive paste preferably includes at least one conductive powder selected from particulate conductive powder, fibrous conductive powder, and flaky conductive powder. This is because by including one of them, the thixotropic ratio of a predetermined conductive paste can be adjusted to range from 3 to 30 and a conductive layer having a predetermined resistance range can be obtained after solidification. In particular, by adjusting the thixotropic ratio to fall within this range, the conductive paste can be prevented from soaking more than necessary into a knit, so that high-quality patterning is achieved.

The viscosity described above may be a viscosity measured at 25° C., with a viscometer (BROOKFIELD rotational viscometer DV-E) using a rotator with a spindle SC4-14 at a rotation speed of 10 rpm. The thixotropic ratio, described above, may be the ratio of a value $\mu_{10\ rpm}$ measured with the viscometer at a rotation speed of 10 rpm to a value $\mu_{100\ rpm}$ measured with the viscometer at a rotation speed of 100 rpm ($\mu_{10\ rpm}/\mu_{100\ rpm}$).

The conductive paste or the conductive layer may contain various admixtures for the purpose of enhancing various properties, such as productivity, weather resistance, and heat resistance. Examples of the admixtures include various functionality improvers, such as plasticizer, reinforcing material, color agent, heat resistance improver, flame retardant, catalyst, hardening retardant, and anti-degradation agent.

An elastic modulus E'2 of the conductive layer preferably ranges from 2 MPa to 60 MPa. This is because the conductive layer itself needs to be flexible to some degree. If the elastic modulus E'2 is less than 2 MPa, the relative amount of conductive powder contained is too small and conductivity may be lost by stretching. On the other hand, if the elastic modulus E'2 exceeds 60 MPa, the conductive layer may be too hard and wrinkles or undulations tend to remain in the fabric. In the present specification and appended claims, the elastic modulus E' refers to a storage elastic modulus E' measured when a test specimen is stretched in tensile mode of a dynamic viscoelasticity measuring device. The elastic modulus E' of the conductive layer is also denoted by "E'2" for distinction from, for example, the elastic modulus E' of a base layer. The elastic modulus E' of the conductive layer can be measured using a test specimen obtained by forming a raw material composition for the conductive layer into a shape that allows measurement of the elastic modulus E'.

The width of the conductive layer may be set to any appropriate size, but is preferably greater than or equal to 0.1 mm, and is more preferably greater than or equal to 0.5 mm. This is because if the width is smaller than 0.1 mm, the conductive layer is too narrow to easily achieve desired conductivity, and moreover, the conductive layer becomes more likely to break. If the width of the conductive layer is greater than or equal to 0.5 mm, it is easy to enhance durability to withstand, for example, putting on and taking off and washing.

At the same time, the width of the conductive layer is preferably smaller than or equal to 10 mm. If the width of the conductive layer exceeds 10 mm, the conductive layer is too wide to absorb distortion even if the base layer used is highly stretchable. Such distortion in the conductive layer makes it more likely, for example, that undulations will occur. It is therefore more preferable that the width of the conductive layer be smaller than or equal to 5 mm.

The conductive layer may be provided not only on the front surface of the fabric, but also on the back surface of the fabric. Then if, for example, the conductive layer on one surface of the fabric extends in a direction perpendicularly intersecting the conductive layer on the other surface of the fabric in plan view, these conductive layers may serve as a sensor that detects in-plane displacement in more than one direction. This is because from the ratio between changes in the resistance values of the conductive layers on the front and back surfaces, the direction of stretch can be detected. When the fabric has the conductive layers on both surfaces thereof, adding a base layer can improve insulation and prevent short circuit between the conductive layer on the front side and the conductive layer on the back side.

<Base Layer>: Base layer is a layer interposed between the conductive layer and the fabric. When the base layer is soaked into the fabric, the soaked portion is included in a layer referred to as the base layer. The base layer is formed by a polymeric matrix. For improved adhesion to the conductive layer, the polymeric matrix is preferably formed of the same type of material as the polymeric matrix forming the conductive layer.

Even when soaked into the fabric, the base layer is formed along the surface of the fabric. When the base layer is formed by the same polymeric matrix as the polymeric matrix forming the conductive layer, the base layer and the conductive layer are inseparably combined. However, a portion that is close to the fabric, lacks conductive components, and does not provide desired conductivity, is the base layer. If a layer having a resin component different from the conductive layer is formed between the conductive layer and the fabric, the layer may be identified as a base layer different from the conductive layer. However, if the base layer is formed by the same polymeric matrix as the conductive layer, it is difficult to strictly distinguish the base layer from the conductive layer.

Although the base layer is formed at least at the boundary between the conductive layer and a portion of the fabric having the conductive layer thereon, the base layer may extend over the surface of the fabric to have a larger area than the conductive layer. This is because this makes it easier to use, as the base layer, a layer that is more stretchable than the conductive layer, and also because by creating a multilayer portion of the base layer and the fabric around the conductive layer, undulations or other problems caused by the presence of the conductive layer can be reduced.

The elastic modulus E' of the base layer preferably ranges from 1 MPa to 10 MPa (for distinction from the other elastic moduli, the elastic modulus E' of the base layer is also denoted by "E'1"). This is because the base layer requires a predetermined level of flexibility for absorbing local variations in the stretch of the fabric. The spaces between twisted yarns created by stretching the fabric, or the spaces between ridges in the fabric created by differences in how the fabric is woven or knitted, are locally widened. Therefore, it is necessary to prevent this from affecting the conductive layer. If the elastic modulus E' of the base layer is less than 1 MPa or exceeds 10 MPa, wrinkles or undulations tend to remain in the fabric. The measurement of the elastic modulus E' of the base layer and the preparation of test specimens for the measurement can be carried out in the same manner as in the conductive layer.

Various functional layers may be formed, as necessary, on the surface of the stretchable wire member. For example, a protective layer for covering the conductive layer may be provided on the surface of the fabric adjacent to the conductive layer. The protective layer is preferably formed of a highly stretchable resin material. This protects the surface of the conductive layer and enables the conductive layer to be reliably secured to the fabric. It is more preferable that the protective layer be formed of the same resin material as the base layer.

Although the protective layer is provided to cover at least the conductive layer, the protective layer may be sized to reach the surface of the base layer or fabric around the conductive layer.

An adhesive layer may be provided on at least one of the front and back surfaces of the stretchable wire member. When the adhesive layer is formed on the surface adjacent to the conductive layer, the stretchable wire member may be used, with the adhesive layer adhering to the skin, so that the conductive layer is invisible from the surface of the fabric. The stretchable wire member can thus be used without spoiling the decorativeness of the fabric. On the other hand, when the adhesive layer is formed on the surface remote from the conductive layer, the conductive layer can be brought to the outside of the fabric. This makes the conductive portion less affected by sweat from the human body.

For the adhesive layer, a material similar to that for adhesive bandages or compresses can be used. Examples of the material include an acrylic pressure sensitive adhesive and polymer gel. With the adhesive layer, the stretchable wire member can adhere to the skin and thus can be suitably used for the purpose of providing enhanced adhesion to the body.

The base layer may have a clearance hole in part of the surface thereof having the conductive layer thereon. At the position of the clearance hole, the conductive layer is directly disposed on the fabric. This configuration provides the following characteristics of the stretchable wire member.

First, the conductive layer directly disposed on the fabric has a larger resistance value and a larger rate of change in resistance value than the conductive layer disposed on the base layer. The conductivity of part of the conductive portion permeated in the fabric is inhibited by the insulating property of the fabric, and this explains the increase in resistance value. The increase in the rate of change in resistance value is explained by the following reason. That is, as described, the degree of stretch of the fabric varies from one point to another. When a base layer is provided, the base layer functions as a buffer layer to allow the entire conductive layer to be stretched evenly. When no base layer is provided, on the other hand, the conductive layer is stretched to a greater degree at some points where the fabric is stretched to a greater degree. Presumably, this increases the resistance value to a greater degree and makes the rate of change in resistance value larger than that when the entire conductive layer is stretched evenly.

Second, in the configuration where the conductive layers are provided on the front and back sides of the fabric, the clearance hole in the base layer allows conductive connection therethrough between the conductive layers on the front and back sides. More specifically, by allowing the conductive ink to permeate from one to the other surface of the fabric through the spaces between fibers forming the fabric, the conductive connection between the front and back sides is achieved. Therefore, the conductive ink permeated through the clearance hole is preferably of low viscosity and high permeability. In this example, after a base layer is provided on the fabric, a through hole that penetrates both the fabric and the base layer may be formed. In this configuration, the base layer permeates in the fabric around the clearance hole. Therefore, even when the fibers of the fabric are cut to form the through hole, the fabric can be prevented from raveling because the fabric is held by the base layer. The configuration with the through hole is also advantageous in that it does not require the use of conductive ink with low viscosity.

<Method for Manufacturing Stretchable Wire Member>: To manufacture a stretchable wire member, for example, a resin composition to be formed into a base layer is applied onto the surface of a fabric by printing or other methods. Then, a raw material composition to be formed into a conductive layer is applied onto the surface of the base layer by printing or other methods. To add a protective layer or other layers, an appropriate raw material composition is further applied by printing or other methods. The stretchable wire member is thus obtained.

An alternative manufacturing method is that after a resin composition to be formed into a protective layer is applied by printing onto a release sheet, a transfer sheet on which a raw material composition to be formed into a conductive layer is applied by printing or other methods is prepared on the surface of the protective layer. Next, for example, a resin composition to be formed into a base layer is applied onto the transfer sheet by printing or other methods. After the transfer sheet is placed over a fabric, with the base layer facing the fabric, the base layer is cured and fastened to the fabric. Then, by peeling off the release sheet, a stretchable wire member is obtained which includes the fabric having thereon the base layer, the conductive layer, and the protective layer integrated together.

<Characteristics of Stretchable Wire Member>: Terms that define the characteristics of the stretchable wire member will now be described. The term "100% stretch" means that the stretchable wire member is stretched 100%, held in the same state for five minutes, and released. This means, in other words, that after being stretched by its own length, the stretchable wire member is held in the same state for five minutes and then released. In the case of a 10-cm-long test specimen, for example, after being stretched by 10 cm, which is its own length, to be 20 cm long, the test specimen is held for five minutes and released. This also includes stretching only part of the test specimen, such as stretching only a central 5-cm-long portion of the 10-cm-long test specimen. In this case, the 5-cm-long portion is stretched to be 10 cm long, held for five minutes, and released. Unless otherwise stated, however, the entire test specimen prepared is stretched.

The term "100% stretch distortion" refers to the amount of distortion obtained when the stretchable wire member is stretched 100%, held in the same state for five minutes, released, and measured ten seconds after the release. For example, when this test is performed on a 10-cm-long test specimen and the test specimen becomes 11 cm long as a result, then the stretch distortion is 10%. When only a central 5-cm-long portion of the 10-cm-long test specimen is stretched to be 10 cm long, held for five minutes, and released, if the central 5-cm-long portion becomes 5.5 cm long ten seconds after being released, then the stretch distortion is 10%. Again, unless otherwise stated, the term "100% stretch distortion" applies to the case where the entire test specimen prepared is stretched.

For such a stretchable wire member, it is preferable that the 100% stretch distortion of the stretchable wire member be less than or equal to 10%. This is because if the 100% stretch distortion of the stretchable wire member exceeds 10%, the resulting stretchable wire member is no longer considered the same as the stretchable wire member in the original state.

An undulation length measured after 100% stretch of the stretchable wire member is preferably less than or equal to 7%. The undulation length refers to the net length of the stretchable wire member after the stretchable wire member is stretched 100%. If only a part of the stretchable wire member is stretched 100%, the undulation length is the net length of the stretched part. For example, when undulations occur, even when an apparent length is the same as the length of a test specimen, hidden distortion may emerge after correction of the undulations. This is less likely to cause problems in individual materials or test specimens stacked in layers, but is found to often occur when the base layer or the conductive layer is provided in part of the fabric. A method for measuring the length of undulations involves measuring, after ten seconds of a stretch test, the length along undulations. More specifically, a released sample is placed on a flat base with good sliding properties (e.g., acrylic plate) and a transparent plate (e.g., acrylic plate) is placed over the sample to correct the undulations. The undulation length is obtained by measuring the length at this point. It is necessary here to make sure that the sample is not folded or compressed in the stretch direction. If the correction is difficult due to, for example, the size of undulations, a portion to be measured may be cut with a blade to measure the length of the cut surface in the stretch direction, so as to measure the undulation length. For cutting with a blade, it is necessary to be careful not to change the length during the cutting. For example, cutting using a cutter is not desirable because of possible generation of stress in the stretch direction. Using a cutting die (Vic or Victoria cutting die, in particular) is desirable because stress will be generated only in a perpendicular direction. If the undulation length exceeds 7%, the undulations are visually noticeable and this affects the appearance of the stretchable wire member.

Also, an undulation height measured after the 100% stretch of the stretchable wire member is preferably less than or equal to 7 mm. When the stretchable wire member is placed on a flat surface after the 100% stretch, a height is created, as a result of undulations, between the highest portion of the stretchable wire member and the flat surface. "Undulation height" refers to the height created here. If the undulation height exceeds 7 mm, the undulations are visually noticeable and this affects the appearance of the stretchable wire member.

In the stretchable wire member, the elastic modulus $E'1$ and the elastic modulus $E'2$ of the base layer and the conductive layer, respectively, constituting the stretchable wire member preferably satisfy the relation $E'2>E'1$. As described above, the fabric is unevenly stretched and a highly stretched region is formed in part of the fabric. To make distortion less likely to occur even in such a highly stretched region, it is preferable to reduce the elastic modulus of the base layer, in particular. By stretching the conductive layer as evenly as possible, an increase in resistance value during stretching can be stabilized. However, if the elastic modulus of the conductive layer is smaller than the elastic modulus of the base layer (or the relation $E'2 \leq E'1$ is satisfied) and the base layer follows the movement of the highly stretched region in the fabric, the conductive layer may stretch similarly to the base layer and this may result in more unevenness in the stretch. On the other hand, if the elastic modulus of the base layer is smaller than the elastic modulus of the conductive layer, the base layer interposed between the conductive layer and the fabric deforms to reduce unevenness in the stretch, on the surface of the base layer adjacent to, and restrained by, the conductive layer, which is harder. This can stabilize a change in conductivity during stretching.

The elastic modulus $E'$ measured on a test specimen made by preparing the fabric, the base layer, and the protective layer of the stretchable wire member by forming the base layer on the surface of the fabric and further forming the protective layer on the surface of the base layer, preferably ranges from 1 MPa to 6 MPa (for distinction from the other elastic moduli $E'$, the elastic modulus of the multilayer body including the fabric, the base layer, and the protective layer is also denoted by "$E'3$"). Also, the elastic modulus $E'$ measured on a test specimen made by preparing the fabric, the base layer, the conductive layer, and the protective layer of the stretchable wire member by forming the base layer on the surface of the fabric, forming the conductive layer on the surface of the base layer, and further forming the protective layer on the surface of the conductive layer, preferably ranges from 3 MPa to 8 MPa (for distinction from the other elastic moduli, the elastic modulus of the multilayer body including the fabric, the base layer, the conductive layer, and the protective layer is also denoted by "$E'4$"). If the elastic modulus $E'3$ is smaller than 1 MPa, since the crosslinking density of the resin material is too small, the shape restoring force may be reduced and the occurrence of distortion may become more likely. On the other hand, if the elastic modulus $E'3$ is greater than 6 MPa, undulations are more likely to occur. If the elastic modulus $E'4$ is smaller than 3 MPa, since the crosslinking density of the conductive layer is too small and the force for retaining conductive particles is too small, wires may be easily broken by repetition of stretching. On the other hand, if the elastic modulus $E'4$ is greater than 8 MPa, the hardness may cause wires to easily break and the occurrence of undulations may become more likely.

The elastic modulus $E'3$ of the multilayer body including the fabric, the base layer, and the protective layer, and the elastic modulus $E'4$ of the multilayer body including the fabric, the base layer, the conductive layer, and the protective layer, preferably satisfy the relation $E'4>E'3$. By making the elastic modulus $E'4$ of the multilayer body including the conductive layer greater than the elastic modulus $E'3$ of the multilayer body not including the conductive layer, the conductive layer becomes less likely to follow movement of the base layer. This allows the entire conductive layer to be evenly stretched and can reduce the occurrence of distortion. It is also possible to reduce an increase in the resistance value of the conductive layer.

In the stretchable wire member, the ratio of the undulation length measured after the 100% stretch to a distortion length under no load is preferably less than two. If the ratio of the undulation length measured after the 100% stretch to the distortion length under no load exceeds two, the undulations are visually noticeable and this affects the appearance of the stretchable wire member. The distortion length under no load refers to a length measured, on the same test specimen as that used to measure the undulation length, by perpendicularly observing the surface of the fabric without correcting the undulations.

Also, in the stretchable wire member, the number of undulations per unit length counted, in a 50 mm pre-stretch length range, after 100% stretch, is preferably one or zero. If the number of undulations counted, in a 50 mm pre-stretch length range, after 100% stretch is greater than or equal to two, then the undulations are visually noticeable and this affects the appearance more than when there are fewer undulations. Note that "in a 50 mm pre-stretch length range" is stated to indicate that if the test specimen is 50 mm long, the number of undulations is counted over the entire test specimen after 100% stretch of the entire test specimen, whereas if the test specimen is longer than 50 mm, the number of undulations is counted in a 50-mm-long portion of the test specimen after 100% stretch of the 50-mm-long portion. The number of undulations refers to the number of undulations counted within the stretched portion (or its length range).

When the stretchable wire member is used as, for example, a wearable sensor, it can be used with wires connected to both ends of the conductive layer and further connected to a control module. The control module includes a battery, a wireless communication unit, and a control unit. The control module is configured to detect changes in resistance value that varies as the conductive layer extends and contracts, and then to transmit the detection signal, for example, to a separate wearable operation terminal such as a wearable watch, or to a personal computer. A compact control module and wires can be attached to the fabric and used.

EXAMPLES

Test specimens described below were prepared to perform various tests.

Preparation of Test Specimens for Each Sample

<Preparation of Test Specimens for Base Layer>: A raw material to be formed into the base layer was applied onto a film and cured into an 80-µm-thick cured body. After the cured body was peeled off the film, test specimens to be formed into dumbbell-shaped base layers were cut out of the cured body with a dumbbell-shaped No. 8 type Victoria cutting die. A raw material of the base layer, used to make test specimens for each sample, is shown in the following tables. In the tables, for example, "liquid silicone with hardness A20" for "base layer" indicates that a raw material composition to be formed into the base layer is a thermosetting liquid silicone composition and it has a type-A hardness of 20 after being cured.

<Preparation of Test Specimens for Conductive Layer>: For the conductive layer, test specimens of the same thickness and shape were prepared in the same manner as in the base layer. A raw material of the conductive layer, used to make test specimens for each sample, is shown in the following tables. In the tables, for example, "silicone ink" for "conductive layer" is an ink for forming the conductive layer, obtained by mixing 400 parts by mass of silver powder (or flaky particles with an average diameter of 17 µm), which is a conductive material, into 100 parts by mass of a liquid silicone composition having a hardness of A25 after being cured. "Urethane ink" is an ink for forming the conductive layer, obtained with the same composition as the silicone ink, except that a nitrile rubber composition (A50 in hardness, if cured independently) is used instead of the silicone composition of the silicone ink.

<Preparation of Test Specimens for Multilayer Body of Fabric+Base Layer+Protective Layer (1)>: A 400-µm-thick smooth knit fabric was cut to a size of 110 mm×25 mm such that the course direction thereof was the longitudinal direction. A base layer with a 100 mm×15 mm pattern was formed by printing with a volume of 80-µm-thick layer if applied to a non-absorbing film. The fabric and the base layer had a total thickness of 410 µm after the printing. This means that a 70-µm-thick portion of the base layer permeated into the fabric. In other words, a 10-µm-thick portion of the base layer, which was 80 µm thick, was on the surface of the fabric. Then, a 20-µm-thick protective layer with the same pattern as the base layer was formed by printing on the surface of the base layer. In this test specimen, the fabric is exposed 5 mm to the outside of the base layer in the width direction. A test specimen with the following patterns, prepared as described above, is defined as test specimen (1):

fabric: 110 mm×25 mm (course direction is the longitudinal direction);

base layer: 100 mm×15 mm (placed in the center of the fabric); and protective layer: 100 mm×15 mm (placed in the same position as the base layer).

<Preparation of Test Specimens for Multilayer Body of Fabric+Base Layer+Protective Layer (2)>: A multilayer body was formed, which has the same multilayer structure as that described in Preparation of Test Specimens for Multilayer Body of Fabric+Base Layer+Protective Layer (1). From this multilayer body, dumbbell-shaped test specimens were cut out with a dumbbell-shaped No. 8 type Victoria cutting die. The entire dumbbell shape is multilayered. A dumbbell-shaped test specimen prepared as described above is defined as test specimen (2).

"Same as base layer" stated in the row for "protective layer" indicates that the protective layer was formed using the same raw material composition as that for the base layer of the corresponding sample. "Thick film" for sample 6 indicates that a 220-µm-thick protective layer was formed using the same raw material composition as that for the base layer. "Hard layer" for sample 7 indicates that a protective layer harder than the base layer was formed, and that the protective layer was formed using the same raw material composition as that for sample 4. The tables also show that sample 10 was formed without the protective layer.

<Preparation of Test Specimens for Multilayer Body of Fabric+Base Layer+Conductive Layer+Protective Layer (3)>: Test specimens for a multilayer body of fabric+base layer+conductive layer+protective layer were made in the same manner as for the multilayer body of fabric+base layer+protective layer, except that the process of forming the base layer in making the multilayer body of fabric+base layer+protective layer, described above, was followed by an additional process which involved forming a 50-µm-thick conductive layer with a 105 mm×10 mm pattern by printing on the surface of the base layer. A test specimen with the following patterns, prepared as described above, is defined as test specimen (3):

fabric 110 mm×25 mm (course direction is the longitudinal direction);

base layer 100 mm×15 mm (placed in the center of the fabric);

conductive layer 105 mm×10 mm (placed in the center of the base layer); and protective layer 100 mm×15 mm (placed in the same position as the base layer).

<Preparation of Test Specimens for Multilayer Body of Fabric+Base Layer+Conductive Layer+Protective Layer (4)>: A multilayer body was formed, which has the same multilayer structure as that described in Preparation of Test Specimens for Multilayer Body of Fabric+Base Layer+Conductive Layer+Protective Layer (1). From this multilayer body, dumbbell-shaped test specimens were cut out with a dumbbell-shaped No. 8 type Victoria cutting die. The entire dumbbell shape is multilayered. A dumbbell-shaped test specimen prepared as described above is defined as test specimen (4).

The tables below show raw materials for the base layer and the protective layer forming test specimens for each sample.

TABLE 1

| | | | Sample 1 | Sample 2 | Sample 3 | Sample 4 | Sample 5 |
|---|---|---|---|---|---|---|---|
| Raw Material of Each Layer | Base Material | | Fabric | Fabric | Fabric | Fabric | Fabric |
| | Base Layer (thickness in μm) | | Liquid Silicone (80) with Hardness A20 | Liquid Silicone (80) with Hardness A40 | Liquid Silicone (80) with Hardness A60 | Liquid Silicone (80) with Hardness A70 | Liquid Silicone (80) with Hardness A40 |
| | Conductive Layer (thickness in μm) | | Silicone Ink (50) | Silicone Ink (50) | Silicone Ink (50) | Silicone Ink (50) | Silicone Ink (50) |
| | Protective Layer (thickness in μm) | | Same as Base Layer (20) | Same as Base Layer (20) | Same as Base Layer (20) | Same as Base Layer (20) | Same as Base Layer (20) |
| Base Layer | Elastic Modulus of Base Layer [MPa] | | 1.4 | 3.0 | 5.4 | 6.2 | 3.0 |
| Conductive Layer | Elastic Modulus of Conductive Layer [MPa] | | 25.3 | 25.3 | 25.3 | 25.3 | 53.5 |
| Multilayer Body of Fabric + Base Layer + Protective Layer | Elastic Modulus of Multilayer Body [MPa] | | 1.1 | 1.9 | 2.1 | 3.5 | 1.9 |
| | Frequency Dependence of Elastic Modulus [MPa] | | 0.25 | 0.15 | 0.28 | 0.41 | 0.17 |
| | Stretch Distortion [%] Shape 1 (4 mm wide) | 20% Stretch | 0 | 0 | 0 | 0 | 0 |
| | | 50% Stretch | 0 | 2.0 | 1.3 | 1.3 | 2.0 |
| | | 100% Stretch | 1.3 | 3.3 | 9.3 | 8.0 | 3.3 |
| | Tensile Load F [N] Shape 1 (4 mm wide) | 20% Stretch | 0.1 | 0.16 | 0.42 | 0.8 | 0.16 |
| | | 50% Stretch | 0.12 | 1.18 | 1.14 | 1.7 | 1.18 |
| | | 100% Stretch | 0.7 | 2.02 | 1.84 | 2.8 | 2.02 |
| | Load Parameter $F_{100}/F_{50}$ | | 5.8 | 1.7 | 1.6 | 1.6 | 1.7 |
| | Undulation Length [%] | | 0% | 0% | 4% | 6% | 0% |
| | Distortion under No Load [%] | | 0% | 1% | 4% | 6% | 1% |
| | Appearance 5 mm outside Base (Evaluation) | | Undulations: None (5) | Undulations: None (5) | Undulations: Little (5) | Undulations: Some (4) | Undulations: None (5) |
| | Undulation Height [mm] | | 1 | 2 | 5 | 6 | 2 |
| | Number of Undulations [counts] | | 1 | 1 | 1 | 1 | 1 |
| | Undulation Angle [degrees] | | 0 | 0 | 5 | 25 | 0 |
| | Undulation Height × Number | | 1 | 2 | 5 | 6 | 2 |
| | Undulation Length/Distortion under No Load | | — | 0 | 1.0 | 1.0 | 0 |

TABLE 2

| | | | Sample 1 | Sample 2 | Sample 3 | Sample 4 | Sample 5 |
|---|---|---|---|---|---|---|---|
| Raw Material of Each Layer | Base Material | | Fabric | Fabric | Fabric | Fabric | Fabric |
| | Base Layer (thickness in μm) | | Liquid Silicone (80) with Hardness A20 | Liquid Silicone (80) with Hardness A40 | Liquid Silicone (80) with Hardness A60 | Liquid Silicone (80) with Hardness A80 | Liquid Silicone (80) with Hardness A40 |
| | Conductive Layer (thickness in μm) | | Silicone Ink (50) | Silicone Ink (50) | Silicone Ink (50) | Silicone Ink (50) | Silicone Ink (50) |
| | Protective Layer (thickness in μm) | | Same as Base Layer (20) | Same as Base Layer (20) | Same as Base Layer (20) | Same as Base Layer (20) | Same as Base Layer (20) |
| Multilayer Body of Fabric + Base Layer + Conductive Layer + Protective Layer | Elastic Modulus of Multilayer Body [MPa] | | 3.4 | 4.4 | 5.6 | 6.2 | 4.9 |
| | Stretch Distortion [%] | 20% Stretch | 0 | 0 | 0 | 0 | 0 |
| | | 50% Stretch | 2.7 | 1.3 | 0.7 | 0.7 | 1.5 |
| | | 100% Stretch | 3.3 | 3.3 | 3.3 | 3.3 | 3.6 |
| | Tensile Load F [N] | 20% Stretch | 0.26 | 0.5 | 0.38 | 0.5 | 0.6 |
| | | 50% Stretch | 0.54 | 0.74 | 2.1 | 2.8 | 0.82 |
| | | 100% Stretch | 0.82 | 0.94 | 3.04 | 4.02 | 1.2 |
| | Load Parameter $F_{100}/F_{50}$ | | 1.5 | 1.3 | 1.4 | 1.4 | 1.5 |
| | Undulation Length [%] | | 0% | 0% | 4% | 6% | 0% |
| | Distortion under No Load [%] | | 0% | 0% | 3% | 4% | 0% |
| | Appearance 5 mm outside Base (Evaluation) | | Undulations: None (5) | Undulations: None (5) | Undulations: None (5) | Undulations: Some (4) | Undulations: None (5) |
| | Undulation Height [mm] | | 1 | 1 | 5 | 6 | 2 |
| | Number of Undulations [counts] | | 1 | 1 | 1 | 1 | 1 |
| | Undulation Angle [degrees] | | 0 | 0 | 5 | 15 | 0 |
| | Undulation Height × Number | | 1 | 1 | 5 | 6 | 2 |
| | Undulation Length/Distortion under No Load | | — | — | 1.3 | 1.5 | — |

TABLE 3

|  |  | Sample 6 | Sample 7 | Sample 8 | Sample 9 | Sample 10 |
| --- | --- | --- | --- | --- | --- | --- |
| Raw Material of Each Layer | Base Material | Fabric | Fabric | Fabric | Fabric | Fabric |
|  | Base Layer (thickness in μm) | Liquid Silicone (80) with Hardness A40 | Liquid Silicone (80) with Hardness A40 | Thermoplastic Urethane Sheet (80) with Hardness A88 | Thermoplastic Urethane Sheet (80) with Hardness A96 | Nylon Sheet (100) |
|  | Conductive Layer (thickness in μm) | Silicone Ink (50) | Silicone Ink (50) | Nitrile Rubber Ink (50) | Nitrile Rubber Ink (50) | Nitrile Rubber Ink (50) |
|  | Protective Layer (thickness in μm) | Thick Film (220) | Hard Layer (20) | Same as Base Layer (20) | Same as Base Layer (20) | None |
| Base Layer | Elastic Modulus of Base Layer [MPa] | 1.41 | 4.47 | 28.2 | 97.3 | 149.5 |
| Conductive Layer | Elastic Modulus of Conductive Layer [MPa] | 25.3 | 25.3 | 25.3 | 25.3 | 25.3 |
| Multilayer Body of Fabric + Base Layer + Protective Layer | Elastic Modulus of Multilayer Body [MPa] | 3.5 | 4.3 | 6.8 | 9.6 | 158 |
|  | Frequency Dependence of Elastic Modulus [MPa] | 0.57 | 0.51 | 0.68 | 0.94 | 68 |
|  | Stretch Distortion [%] Shape 1 (4 mm wide) 20% Stretch | 0 | 0 | 0 | 2 | 4 |
|  | 50% Stretch | 0.7 | 0 | 4.0 | 6.0 | 24 |
|  | 100% Stretch | 2.7 | 2.7 | 10.0 | 12.0 | 67 |
|  | Tensile Load F [N] Shape 1 (4 mm wide) 20% Stretch | 1.1 | 0.5 | 1.5 | 2.1 | 4.2 |
|  | 50% Stretch | 1.64 | 0.86 | 1.8 | 2.6 | 4.3 |
|  | 100% Stretch | 3.04 | 1.26 | 2.2 | 3.1 | 4.5 |
|  | Load Parameter $F_{100}/F_{50}$ | 1.9 | 1.5 | 1.2 | 1.2 | 1.0 |
|  | Undulation Length [%] | 6% | 2% | 12% | 8% | 60% |
|  | Distortion under No Load [%] | 4% | 2% | 6% | 4% | — |
|  | Appearance 5 mm outside Base (Evaluation) | Undulations: Some (4) | Undulations: Some (4) | Undulations: Large (2) | Undulations: Large (2) | Undulations: Very Large (1) |
|  | Undulation Height [mm] | 7 | 4 | 8 | 10 | 9 |
|  | Number of Undulations [counts] | 1 | 2 | 2 | 1 | 4 |
|  | Undulation Angle [degrees] | 35 | 20 | 40 | 40 | 90 |
|  | Undulation Height × Number | 7 | 8 | 16 | 10 | 36 |
|  | Undulation Length/Distortion under No Load | 1.5 | 1.0 | 2.0 | 2.0 | — |

TABLE 4

|  |  | Sample 6 | Sample 7 | Sample 8 | Sample 9 | Sample 10 |
| --- | --- | --- | --- | --- | --- | --- |
| Raw Material of Each Layer | Base Material | Fabric | Fabric | Fabric | Fabric | Fabric |
|  | Base Layer (thickness in μm) | Liquid Silicone (80) with Hardness A40 | Liquid Silicone (80) with Hardness A40 | Thermoplastic Urethane Sheet (80) with Hardness A88 | Thermoplastic Urethane Sheet (80) with Hardness A96 | Nylon Sheet (100) |
|  | Conductive Layer (thickness in μm) | Silicone Ink (50) | Silicone Ink (50) | Nitrile Rubber Ink (50) | Nitrile Rubber Ink (50) | Nitrile Rubber Ink (50) |
|  | Protective Layer (thickness in μm) | Thick Film (220) | Hard Layer (20) | Same as Base Layer (20) | Same as Base Layer (20) | None |
| Multilayer Body of Fabric + Base Layer + Conductive Layer + Protective Layer | Elastic Modulus of Multilayer Body [MPa] | 4.6 | 5.8 | 8.7 | 11.2 | 143 |
|  | Stretch Distortion [%] 20% Stretch | 0 | 0 | 0 | 3 | 4 |
|  | 50% Stretch | 1.3 | 1.7 | 5 | 7 | 25 |
|  | 100% Stretch | 2.7 | 3.3 | 7 | 14 | 66 |
|  | Tensile Load F [N] 20% Stretch | 0.46 | 0.51 | 1.6 | 2.2 | 4.3 |
|  | 50% Stretch | 0.82 | 0.78 | 1.8 | 2.8 | 4.4 |
|  | 100% Stretch | 1.1 | 1.3 | 2.0 | 3.1 | 4.4 |
|  | Load Parameter $F_{100}/F_{50}$ | 1.3 | 1.7 | 1.1 | 1.1 | 1.0 |
|  | Undulation Length [%] | 6% | 2% | 11% | 9% | 65% |
|  | Distortion under No Load [%] | 4% | 2% | 7% | 5% | — |
|  | Appearance 5 mm outside Base (Evaluation) | Undulations: Some (4) | Undulations: Some (4) | Undulations: Large (2) | Undulations: Large (2) | Undulations: Very Large (1) |
|  | Undulation Height [mm] | 7 | 4 | 9 | 8 | 8 |
|  | Number of Undulations [counts] | 1 | 2 | 2 | 2 | 4 |
|  | Undulation Angle [degrees] | 30 | 25 | 40 | 45 | 80 |
|  | Undulation Height × Number | 7 | 8 | 18 | 16 | 32 |
|  | Undulation Length/Distortion under No Load | 1.5 | 1.0 | 1.6 | 1.8 | — |

Tests:

<Test 1: Measurement of Storage Elastic Modulus E'>: With a dynamic viscoelasticity measuring device ("DMS6100" from Seiko Instruments Inc.), the storage elastic modulus E' was measured on dumbbell-shaped test specimens for each sample. The test specimens each were held between chuck elements spaced 8 mm apart, and were measured, in tensile mode, at a frequency of 10 Hz and a measurement temperature of 25° C. Each test specimen was held by the chuck at the center of the dumbbell shape and stretched only at its narrow portion having a uniform width. The result is shown in Table 1 and Table 3.

In the tables, "elastic modulus of base layer [MPa]" is the storage elastic modulus E' of a test specimen formed by the base layer alone, and "elastic modulus of conductive layer [MPa]" is the storage elastic modulus E' of a test specimen formed by the conductive layer alone. Also, "elastic modulus of multilayer body [MPa]" in the section for "multilayer body of fabric+base layer+protective layer" is the storage elastic modulus E' of a test specimen formed by this multilayer body. Similarly, "elastic modulus of multilayer body [MPa]" in the section for "multilayer body of fabric+base layer+conductive layer+protective layer" is the storage elastic modulus E' of a test specimen formed by this multilayer body including the conductive layer.

<Test 2: Measurement of Frequency Dependence>: With the dynamic viscoelasticity measuring device described above, the storage elastic modulus was measured on test specimens for "multilayer body of fabric+base layer+protective layer" at a frequency of 0.1 Hz and also at a frequency of 28 Hz. Then, the difference between the storage elastic modulus measured at 28 Hz and the storage elastic modulus measured at 0.1 Hz was calculated, which is presented in the row for the frequency dependence.

<Test 3: Measurement of Stretch Distortion>: With a tensile testing machine ("Strograph VE5D" from Toyo Seiki Seisaku-sho, Ltd.), three tensile tests were performed on test specimens, each having marks placed 15 mm apart at the center thereof. The tensile tests each involved stretching the test specimens at a speed of 100 mm/min until the length between the marks reached 18 mm (20% stretch), 22.5 mm (50% stretch), or 30 mm (100% stretch). Then, one minute after release of the load, the length between the marks on each test specimen was measured, and the length after the test was compared to the initial length (15 mm) to determine the stretch distortion (%). If the test specimen curled or undulated after the stretch, the test specimen was smoothed out, with no load applied thereto in the tensile direction, to measure the length of the test specimen.

The measurement of stretch distortion described above was performed on test specimen (2) and test specimen (4) that were prepared, as described, for "multilayer body of fabric+base layer+protective layer" and "multilayer body of fabric+base layer+conductive layer+protective layer", respectively. The result is presented, for each degree of stretch, in the section for "stretch distortion [%]" in the tables.

<Test 4: Measurement of Tensile Load>: During test 2 described above, a tensile load applied was also measured for each of 20% stretch, 50% stretch, and 100% stretch. The result is also presented in the tables.

<Test 5: Shape Observation>: A tensile test was performed using the same tensile testing machine and at the same speed, as in test 2. Test 5 involved using test specimen (1) and test specimen (3) for each sample. Each test specimen was provided with a pair of marks placed 50 mm apart, at the center thereof, in the longitudinal direction and stretched until the length 50 mm between the marks reached 100 mm (100% stretch). Then, each test specimen was taken out of the testing machine and observed. The result is also shown in the tables.

"Undulation length [%]" in the tables is the length of a test specimen measured after 100% stretch in the following method. That is, after a released sample was placed on a flat acrylic plate, a transparent acrylic plate was placed over the sample to correct undulations. Then, the resulting length was measured with a ruler. A value obtained by dividing, by the initial length, an increase in length from the initial length was expressed in percentage. For example, if the length measured is 55.0 mm, the increase in length is 5.0 mm. Thus, calculating 5.0 mm/50 mm yields 10% as an undulation length.

"Distortion under no load [%]" was obtained by measuring the length of a test specimen after 100% stretch in the following method. That is, a released sample was placed on a flat acrylic plate, and the length of the sample was measured with a ruler. Then, a value obtained by dividing, by the initial length, a change in length from the initial length was expressed in percentage. That is, the measurement was performed in the same manner as in the measurement of undulation length, except that the length was measured without correcting undulations. For example, if the length measured is 52.0 mm, calculating 2.0 mm/50 mm yields 4% as a distortion under no load. "Undulation length/distortion under no load" is a value obtained by diving the undulation length by the distortion under no load. With "1" indicating that there were no undulations, the value increases as the degree of undulations increases.

"Appearance 5 mm outside base" in the tables was rated on a four-point scale by observing the outer edge of the fabric of test specimen (1) and test specimen (3) for each sample to check for any distortions or undulations. A sample with no undulations was rated "5", a sample with some undulations was rated "4", a sample with large undulations was rated "2", and a sample with very large undulations was rated "1".

For undulations that occurred in test specimens, the tables show the height [mm], number [counts], height×number, and angle [degrees]. The undulation height is the measured height of undulations that occurred between marks on a test specimen that was placed on a horizontal base and secured thereto in such a manner that the distance between the marks stayed the same as the initial length. The number of undulations that occurred between the marks was counted. To make the index "undulation height×number" significant, a test specimen with no undulations is considered the same as a test specimen with only one undulation. This means that the number of undulations in the test specimen with no undulations is indicated as "1" in the tables. The undulation angle indicates the angle of rise of undulations from the horizontal plane. The index "height×number" combines the height and the number of undulations so that the determination of which produced a better result is unlikely to be reversed.

"Load parameter" in the tables is an index indicating the dependence of tensile load on the stretch rate, that is, a value obtained by calculating "$F_{100}/F_{50}$" which is the ratio of a tensile load $F_{100}$ applied by 100% stretch to a tensile load $F_{50}$ applied by 50% stretch. If the load parameter exceeds 10, stretchability may be inhibited due to limitation in stretch of the fabric. On the other hand, if the load parameter is less than 1.2, a plastically deformed region may have been present, or a load applied by a large stretch may have been lowered by cracks or other problems.

<Discussion>: For samples 1 to 7, the 100% stretch distortion did not exceed 10%. Even after 100% stretch, the undulation length did not exceed 7%, the undulation height did not exceed 7 mm, and the number of undulations was one or zero. Therefore, even after stretch of the stretchable wire member, the occurrence of wrinkles and undulations was limited. In the test specimens, the elastic modulus E'3 of the multilayer body portion including the fabric, the base layer, and the protective layer was in the 1 MPa to 6 MPa range, the elastic modulus E'4 of the multilayer body portion including the fabric, the base layer, the conductive layer, and the protective layer was in the 3 MPa to 8 MPa range, and the relation E'4>E'3 was satisfied. Also, frequency dependence represented by the difference (E'4−E'3) between the storage elastic modulus E'3 of the multilayer body portion including the fabric, the base layer, and the protective layer, measured at a frequency of 0.1 Hz, and the storage elastic modulus E'4 measured at a frequency of 28 Hz was found not to exceed 0.6 MPa.

As for samples 8 to 10, on the other hand, although the 100% stretch distortion of sample 8 was 7%, the undulation length measured after 100% stretch exceeded 7% in all of these samples, including sample 8. Also, the undulation height exceeded 7 mm, the number of undulations was two or more, the frequency dependence exceeded 0.6 MPa, and the occurrence of wrinkles and undulations in the stretchable wire member after the stretch was unable to be prevented.

REFERENCE SIGNS LIST

1: plain stitch
   1a: first layer
   1b: second layer
2: rib stitch
   2a: first layer
   2b: second layer
   2c: third layer

The invention claimed is:

1. A stretchable wire member comprising:
a fabric;
a base layer formed along a surface of the fabric;
a conductive layer disposed on a part of a surface of the base layer; and
a protective layer covering the conductive layer, and another part of the base layer which is not covered by the conductive layer,
wherein an elastic modulus E'3 of a first multilayer body portion including the fabric, the base layer, and the protective layer, excluding the conductive layer, ranges from 1 MPa to 6 MPa.

2. The stretchable wire member according to claim 1, wherein an elastic modulus E'4 of a second multilayer body portion including the fabric, the base layer, the conductive layer, and the protective layer ranges from 3 MPa to 8 MPa; and
a relation E'4>E'3 is satisfied.

3. The stretchable wire member according to claim 1, wherein the first multilayer body portion is outside a region having the conductive layer.

4. The stretchable wire member according to claim 1, wherein an undulation length measured after the stretchable wire member is stretched 100% is less than or equal to 7%.

5. The stretchable wire member according to claim 1, wherein an undulation height measured after the stretchable wire member is stretched 100% is less than or equal to 7 mm.

6. The stretchable wire member according to claim 1, wherein the number of undulations counted, in a 50 mm pre-stretch length range, after 100% stretch is one or zero.

7. The stretchable wire member according to claim 1, wherein a frequency dependence represented by a difference (E'4−E'3) between a storage elastic modulus E'3 of the first multilayer body portion and a storage elastic modulus E'4, the storage elastic modulus E'3 and the storage elastic modulus E'4 being measured at a frequency of 0.1 Hz and a frequency of 28 Hz, respectively, is less than or equal to 0.6 MPa.

8. The stretchable wire member according to claim 1, wherein an elastic modulus E'1 of the base layer ranges from 1 MPa to 10 MPa;
an elastic modulus E'2 of the conductive layer ranges from 2 MPa to 60 MPa; and
a 100% stretch distortion of the stretchable wire member is less than or equal to 10%.

9. The stretchable wire member according to claim 1, wherein the fabric is at least one knit that is made in plain stitch, rib stitch, smooth stitch, or any one or combination of textural variations of the stitches; and
a longitudinal direction of the conductive layer is a course direction of the knit.

10. The stretchable wire member according to claim 1, wherein the fabric is a knit that is made in purl stitch or a textural variation thereof; and
a longitudinal direction of the conductive layer is a wale direction of the knit.

11. The stretchable wire member according to claim 1, wherein the fabric is at least one knit that is made in tricot, denbigh stitch, vandyke stitch, cord stitch, or any one or combination of textural variations of the stitches; and
a longitudinal direction of the conductive layer is a course direction of the knit.

12. The stretchable wire member according to claim 1, wherein the base layer extends outward more than 2 mm from an outer edge of the conductive layer.

13. The stretchable wire member according to claim 1, wherein a ratio of an undulation length measured after 100% stretch to a distortion length under no load is less than two.

14. The stretchable wire member according to claim 1, wherein a width of the conductive layer is greater than or equal to 0.1 mm and is smaller than or equal to 10 mm.

15. The stretchable wire member according to claim 1, wherein an elastic modulus E'1 of the base layer and an elastic modulus E'2 of the conductive layer satisfy a relation E'2>E'1.

* * * * *